United States Patent
Umeda et al.

(10) Patent No.: US 10,312,427 B2
(45) Date of Patent: Jun. 4, 2019

(54) PIEZOELECTRIC DEVICE

(71) Applicant: Murata Manufacturing Co., Ltd., Nagaokakyo-shi, Kyoto-fu (JP)

(72) Inventors: Keiichi Umeda, Nagaokakyo (JP); Toshio Imanishi, Nagaokakyo (JP); Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 368 days.

(21) Appl. No.: 15/173,810

(22) Filed: Jun. 6, 2016

(65) Prior Publication Data

US 2016/0284974 A1    Sep. 29, 2016

Related U.S. Application Data

(63) Continuation of application No. PCT/JP2014/081018, filed on Nov. 25, 2014.

(51) Int. Cl.

| | |
|---|---|
| *H01L 41/113* | (2006.01) |
| *H01L 41/047* | (2006.01) |
| *H04R 17/02* | (2006.01) |
| *H04R 19/01* | (2006.01) |
| *H01L 41/187* | (2006.01) |

(52) U.S. Cl.
CPC ...... *H01L 41/1138* (2013.01); *H01L 41/0478* (2013.01); *H04R 17/025* (2013.01); *H04R 19/016* (2013.01); *H01L 41/187* (2013.01); *H04R 17/02* (2013.01); *H04R 2201/003* (2013.01)

(58) Field of Classification Search
CPC ............ H01L 41/1138; H01L 41/0478; H04R 17/025; H04R 19/016
See application file for complete search history.

(56) References Cited

U.S. PATENT DOCUMENTS

| | | | |
|---|---|---|---|
| 4,320,664 A | 3/1982 | Rehn | |
| 5,629,483 A | 5/1997 | Nakamura et al. | |
| 5,686,826 A | 11/1997 | Kurtz | |
| 6,275,447 B1 | 8/2001 | Fukukita et al. | |

(Continued)

FOREIGN PATENT DOCUMENTS

| | | |
|---|---|---|
| JP | S67143797 U | 9/1982 |
| JP | 6314948 A | 8/1994 |

(Continued)

OTHER PUBLICATIONS

Williams et al. An AlN MEMS Piezoelectric Microphone for Aeroacoustic Applications, Journal of Microelectromechanical Systems, vol. 21, No. 2, Apr. 2012.

(Continued)

*Primary Examiner* — Bryan P Gordon
(74) *Attorney, Agent, or Firm* — Arent Fox LLP

(57) ABSTRACT

A piezoelectric device that includes: a diaphragm; a supporting part configured to support at least a portion of an end of the diaphragm; a piezoelectric film disposed along a portion supported by the supporting part on the diaphragm, a width of the film along the supported portion being narrower than a width of the portion; a lower electrode disposed at a face of the piezoelectric film on a diaphragm side; and an upper electrode disposed on a face of the piezoelectric film on an opposite side to the diaphragm.

19 Claims, 14 Drawing Sheets

(56) References Cited

U.S. PATENT DOCUMENTS

| | | | |
|---|---|---|---|
| 7,253,488 B2 | 8/2007 | Zhan | |
| 7,856,885 B1 | 12/2010 | Bhansall | |
| 8,029,105 B2 | 10/2011 | Seiber | |
| 8,896,184 B2 | 11/2014 | Grosh | |
| 2004/0081326 A1* | 4/2004 | Michiels | H04R 17/00 381/190 |
| 2004/0135144 A1* | 7/2004 | Yamada | H03H 9/02094 257/59 |
| 2006/0119226 A1 | 6/2006 | Nihei | |
| 2006/0186762 A1* | 8/2006 | Sugiura | B06B 1/0692 310/328 |
| 2008/0101625 A1 | 5/2008 | Fazzio et al. | |
| 2008/0296529 A1 | 12/2008 | Akiyama et al. | |
| 2009/0302716 A1 | 6/2009 | Ohara | |
| 2011/0176690 A1 | 7/2011 | Takano et al. | |
| 2012/0017691 A1* | 1/2012 | Ishihara | G01L 9/0042 73/724 |
| 2013/0038175 A1 | 2/2013 | Ogawa et al. | |
| 2013/0140156 A1* | 6/2013 | Fujii | H01L 41/0838 200/181 |
| 2013/0169113 A1* | 7/2013 | Lim | H01L 41/1138 310/329 |
| 2013/0238072 A1* | 9/2013 | Deterre | H01L 41/0836 607/122 |
| 2014/0015070 A1* | 1/2014 | Zoellin | B81B 3/0021 257/416 |
| 2015/0131816 A1 | 5/2015 | Inagaki | |

FOREIGN PATENT DOCUMENTS

| | | | |
|---|---|---|---|
| JP | H08-43430 A | | 2/1996 |
| JP | H11226011 A | | 8/1999 |
| JP | 2002344279 A | | 11/2002 |
| JP | 2004506394 A | | 2/2004 |
| JP | 2004147319 A | | 5/2004 |
| JP | 2008118639 A | | 5/2008 |
| JP | 2009010926 A | | 1/2009 |
| JP | 2009284111 A | | 12/2009 |
| JP | 2009302661 A | | 12/2009 |
| JP | 2011125071 A | | 6/2011 |
| JP | 2011228794 A | | 11/2011 |
| JP | 2011234568 A | | 11/2011 |
| JP | 2012217035 A | | 11/2012 |
| JP | 2013239858 A | | 11/2013 |
| JP | WO 2014185281 | * | 11/2014 |
| WO | WO 02015636 | | 2/2002 |

OTHER PUBLICATIONS

International Search Report issued for PCT/JP2014/081018, dated Mar. 3, 2015.

Written Opinion of the International Searching Authority issued for PCT/JP2014/081018, dated Mar. 3, 2015.

\* cited by examiner

PIEZOELECTRIC DEVICE

CROSS REFERENCE TO RELATED APPLICATIONS

The present application is a continuation of PCT/JP2014/081018 filed Nov. 25, 2014, which claims priority to U.S. patent application Ser. No. 14/098,630 filed Dec. 6, 2013, the entire contents of each of which are incorporated herein by reference.

FIELD OF TECHNOLOGY

The present invention relates to piezoelectric devices.

BACKGROUND OF THE INVENTION

Electronic apparatuses such as cellular phones may be mounted with a plurality of microphones. For instance, a cellular phone may be provided with a microphone for detecting ambient sound (environmental sound) for a purpose of noise canceling in addition to a microphone for detecting a transmission voice during a call. As more and more electronic apparatuses are mounted with a plurality of microphones, downsizing of microphones is increasingly demanded.

Against a background like this, in recent years, a microphone manufactured using a micro electro mechanical systems (MEMS) technology (hereinafter, referred to as a MEMS microphone) has been drawing an attention (for instance, Patent Publication JP 2004-506394 A).

In mounting a microphone onto an electronic apparatus, not only downsizing of a microphone but also sensitivity enhancement of the microphone is required. Sensitivity enhancement is required also for a MEMS microphone.

SUMMARY OF THE INVENTION

The present invention has been made in consideration of such circumstances, and an object thereof is to enhance the sensitivity of a MEMS microphone.

A piezoelectric device related to one aspect of the present invention includes: a diaphragm; a supporting part configured to support at least a part of an end of the diaphragm; a piezoelectric film disposed on the diaphragm along a portion supported by the supporting part, a width of the film along the supported portion being narrower than a width of the portion; a lower electrode disposed on a surface of a diaphragm side of the piezoelectric film; and an upper electrode disposed on a face of the piezoelectric film on an opposite side to the diaphragm.

According to the present invention, the sensitivity of a MEMS microphone can be improved.

DETAILED DESCRIPTION OF THE PREFERRED EMBODIMENTS

Figure 1:
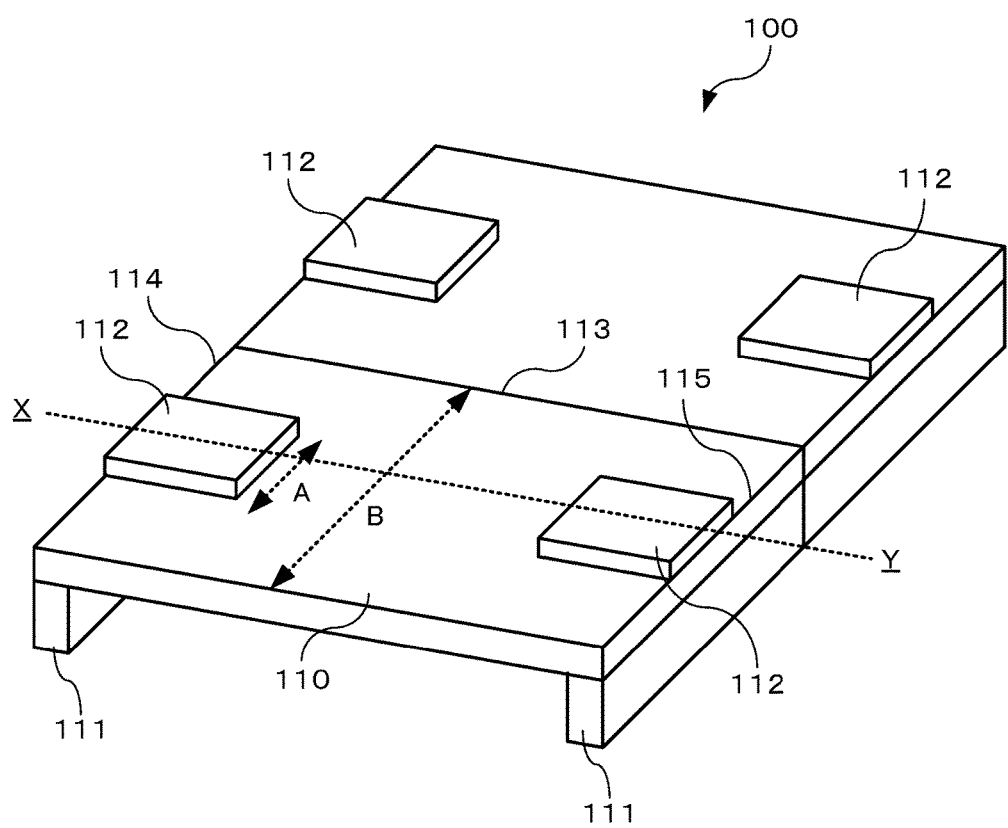
FIG. 1 is a view showing an appearance of a piezoelectric device of one embodiment of the present invention.

One embodiment of the present invention is described below with reference to the drawings. FIG. 1 is a view showing an appearance of a piezoelectric device of one embodiment of the present invention. A piezoelectric device 100 is a device for configuring a MEMS microphone that converts sound pressure into an electrical signal, and includes a diaphragm 110, a supporting part 111, and piezoelectric parts 112. The piezoelectric device 100 is divided into two by a minute slit 113 of about 1 μm or less wide for instance.

The diaphragm 110 is a thin film that vibrates due to sound pressure and can be formed of silicon (Si). The diaphragm 110 has a substantially rectangular shape, wherein lower parts of a facing set of sides 114 and 115 are supported by the supporting part 111. In other words, the diaphragm 110 has a both-end supported beam structure. It is beneficial that the diaphragm 110 is degenerate silicon, and has a function as a lower electrode of the piezoelectric part 112 as described later. What is called a degenerate silicon or degenerate semiconductor doped with a dopant in high concentration ($1 \times 10^{19}$ cm$^{-3}$ or over). To be more precise, by doping phosphorus (P), arsenic (As), or antimony (Sb) at a concentration of $1 \times 10^{19}$ cm$^{-3}$ or over into Si as an n-type dopant (a donor), a degenerate semiconductor can be formed. A degenerate semiconductor may also be formed by doping a p-type dopant (an acceptor) into Si.

The piezoelectric parts 112 are disposed along the portion supported by the supporting part 111 on the diaphragm 110. As shown in FIG. 1, a width (A) of the piezoelectric part 112 (a width of a piezoelectric film 210 as described later) is narrower than a width (B) of the portion supported by the supporting part 111 on the diaphragm 110 (in other words, a width of the side 114). For instance, the width (A) of the piezoelectric part 112 may be about 100 μm, and the width (B) of the portion supported by the supporting part 111 on the diaphragm 110 may be about 300 μm. Although four piezoelectric parts 112 are disposed on the diaphragm 110 in the configuration shown in FIG. 1, the number of piezoelectric parts 112 is not limited to this. In the configuration shown in FIG. 1, although ends of the piezoelectric parts 112 are disposed on the sides 114 and 115, ends may be disposed separately from the sides 114 and 115.

Figure 2:
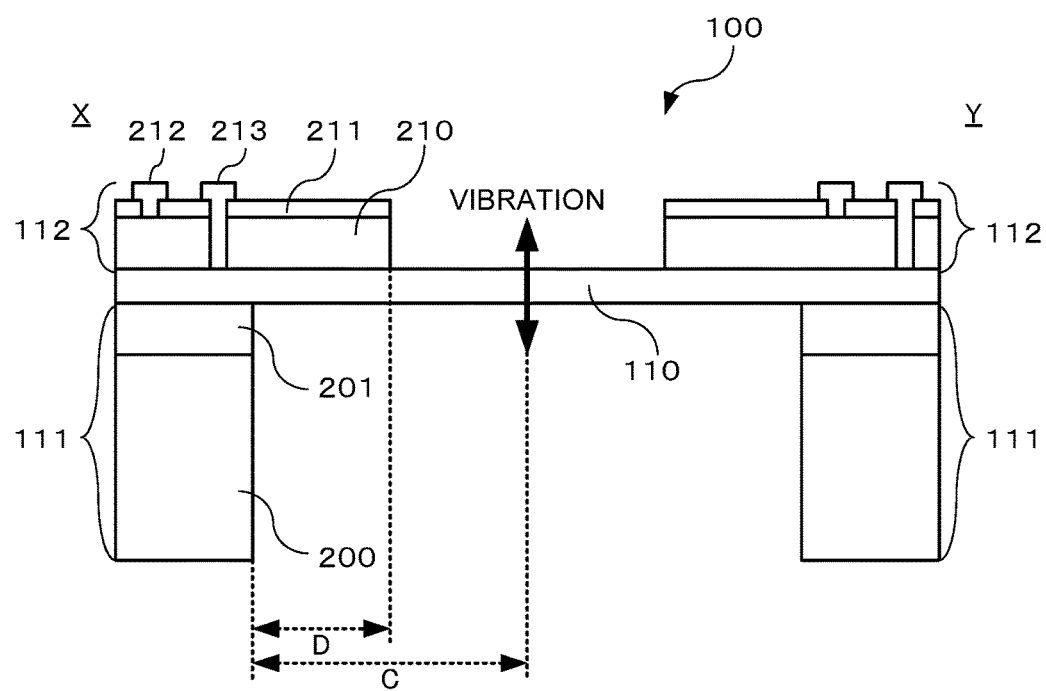
FIG. 2 is a cross-sectional view showing the piezoelectric device.

FIG. 2 is a cross-sectional view of the piezoelectric device 100 at a line X-Y shown in FIG. 1. The supporting part 111 includes a substrate 200 and an insulating layer 201.

The substrate 200 is formed of silicon (Si) for instance. The insulating layer 201 is formed of silicon oxide ($SiO_2$) for instance. The diaphragm 110 is formed on the supporting part 111 formed in this manner.

Each of the piezoelectric parts 112 disposed along the portion supported by the supporting part 111 on the diaphragm 110 includes a piezoelectric film 210, an upper electrode 211, and wirings 212 and 213.

The piezoelectric film 210 is disposed on the diaphragm 110 so as to be vibrated in association with vibration of the diaphragm 110. The piezoelectric film 210 is a thin film of a piezoelectric body that converts force applied by the vibration to voltage, and is formed of scandium doped aluminum nitride (ScAlN) for instance. ScAlN is formed by substituting a part of aluminum (Al) in aluminum nitride (AlN) with scandium (Sc). For instance, ScAlN used for the piezoelectric film 210 may be formed by substituting Al with Sc so that Sc becomes about 40 atom % when atomic concentration that is a sum of the number of Al atoms and the number of Sc atoms is assumed to be 100 atom %. The thickness of the piezoelectric film 210 may be about 500 nm for instance. A ratio of a width (D) of a vibration portion of the piezoelectric film 210 to a width (C) from a center of the diaphragm 110 to the supporting part 111 may be about 40% for instance. The width (C) may be about 300 μm and the width (D) may be about 120 μm for instance.

The upper electrode 211 is disposed on an upper side of the piezoelectric film 210. The upper electrode 211 is a metal electrode and may be formed of aluminum (Al) for instance, and may have a thickness of about 50 nm. The upper electrode 211 may have tensile stress. Since the piezoelectric film 210 formed of ScAlN has a compressive stress, by allowing the upper electrode 211 to have a tensile stress, a stress at the piezoelectric part 112 is corrected and a deformation of the diaphragm 110 can be suppressed.

The wiring 212 is electrically coupled to the upper electrode 211. The wiring 213 is electrically coupled to the lower electrode (the diaphragm 110). The wirings 212 and 213 are formed by using gold (Au), platinum (Pt), titanium (Ti), aluminum (Al), or the like for instance.

Figure 3A:
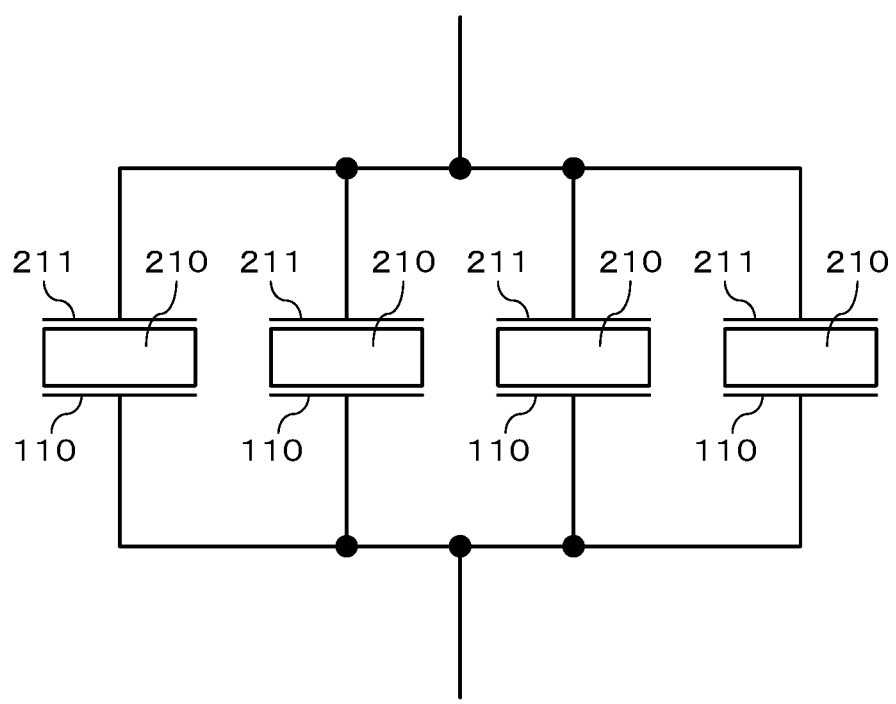
FIG. 3A is a view showing one example of a wiring of an electrode of the piezoelectric device.
Figure 3B:
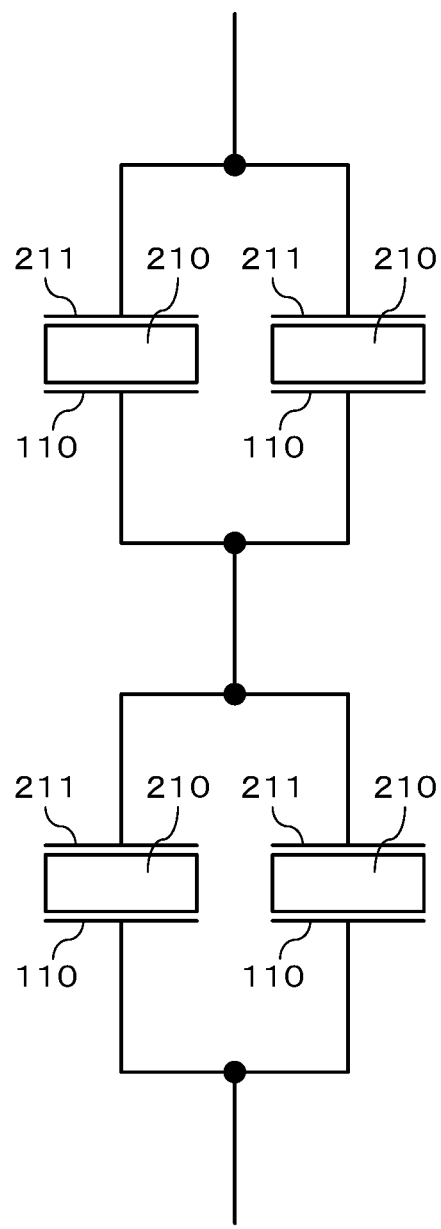
FIG. 3B is a view showing another example of a wiring of an electrode of the piezoelectric device.
Figure 3C:
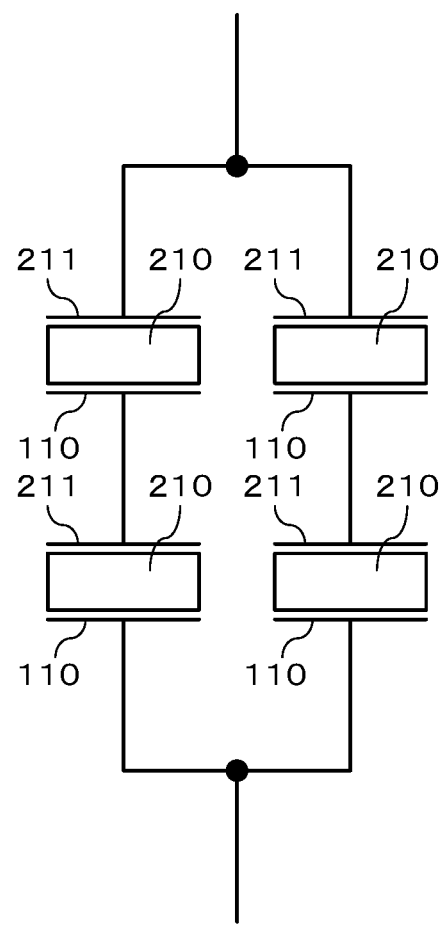
FIG. 3C is a view showing another example of a wiring of an electrode of the piezoelectric device.

In the piezoelectric device 100 of the configuration described above, the piezoelectric film 210 vibrates in association with a vibration of the diaphragm 110 caused by sound pressure. Voltage corresponding to the vibration of the piezoelectric film 210 is output through the wirings 212 and 213 of the piezoelectric body 112. As shown in FIG. 1, four piezoelectric bodies 112 are provided in the piezoelectric device 100. The four piezoelectric bodies 112 can be electrically coupled in parallel as shown in FIG. 3A for instance. The coupling shown in FIG. 3A is just an example and a form of coupling of the piezoelectric bodies 112 is not limited to this. According to exemplary aspects, the four piezoelectric bodies 112 can be electrically coupled in series for instance. Alternatively, the four piezoelectric bodies 112 can be electrically coupled in parallel and in series as shown in FIGS. 3B and 3C for instance.

In the piezoelectric device 100, as shown in FIG. 1, the width (A) of the piezoelectric part 112 (the width of the piezoelectric film 210) is narrower than the width (B) of the portion supported by the supporting part 111 of the diaphragm 110 (in other words, the width of the side 114). Such a structure increases the stress applied to the piezoelectric part 112 by the vibration of the diaphragm 110 caused by sound pressure compared to the case where the piezoelectric part 112 has the same width as the diaphragm 110 (in other words, the width (A) of the piezoelectric part 112=the width (B) of the diaphragm 110). Consequently, the stress applied to a unit area of the piezoelectric part 112 becomes large, and the voltage sensitivity and the generated energy of the piezoelectric part 112 can be increased. In other words, sensitivity of the MEMS microphone configured by using the piezoelectric device 100 can be improved.

Figure 4:
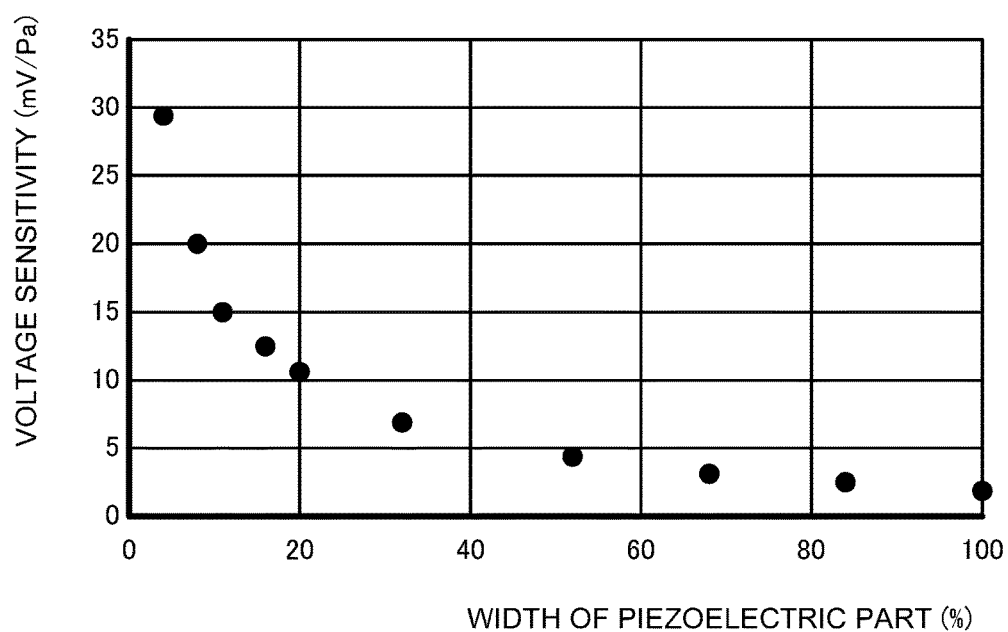
FIG. 4 is a graph showing one example of a relation between a width of a piezoelectric part and voltage sensitivity.

FIG. 4 is a graph showing one example of a relation between the width of the piezoelectric part 112 and the voltage sensitivity at the piezoelectric device 100. In FIG. 4, the horizontal axis represents a ratio (%) of the width (A) of the piezoelectric part 112 to the width (B) of the diaphragm 110, and the vertical axis represents the voltage sensitivity (mV/Pa) showing output voltage (mV) per sound pressure (Pa) at the piezoelectric part 112. As shown in FIG. 4, the voltage sensitivity increases as the ratio of the width of the piezoelectric part 112 to that of the diaphragm 110 decreases. Accordingly, at the piezoelectric device 100 of the embodiment, the voltage sensitivity can be improved.

Figure 5:
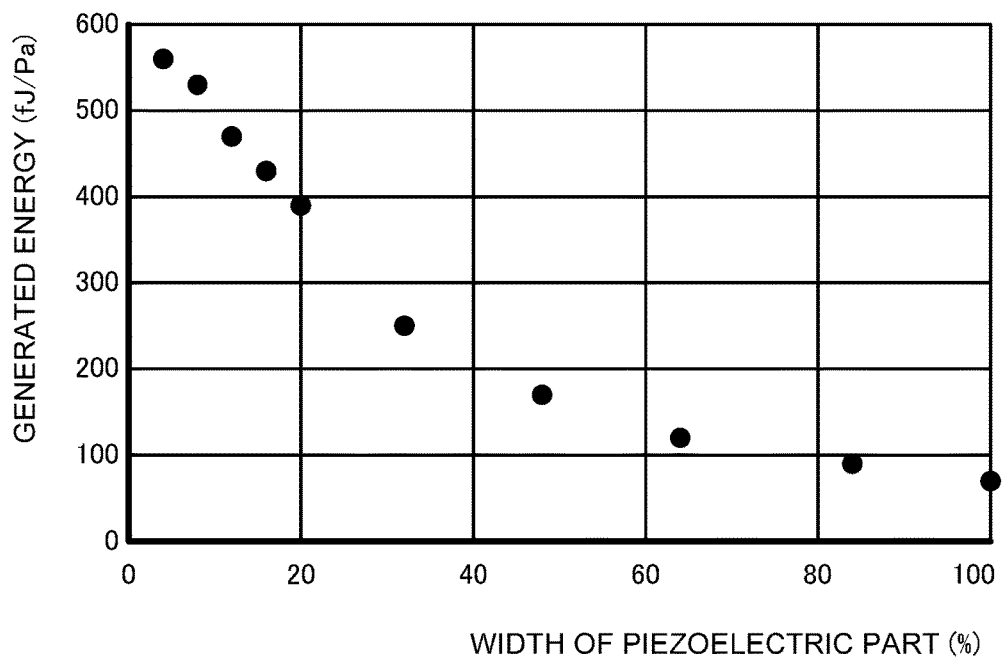
FIG. 5 is a graph showing one example of a relation between a width of the piezoelectric part and generated energy.

FIG. 5 is a graph showing one example of a relation between the width of the piezoelectric part 112 and the generated energy. In FIG. 5, the horizontal axis represents the ratio (%) of the width (A) of the piezoelectric part 112 to the width (B) of the diaphragm 110, and the vertical axis represents the generated energy (fJ/Pa) per sound pressure at the piezoelectric part 112. As shown in FIG. 5, the generated energy increases as the ratio of the width of the piezoelectric part 112 to that of the diaphragm 110 decreases. Accordingly, at the piezoelectric device 100 of the embodiment, the generated energy can be enlarged.

When the width of the piezoelectric part 112 becomes narrow, a capacitance value of the piezoelectric part 112 becomes small. When the capacitance value becomes small, impedance mismatching with an amplifier circuit may be likely to occur due to an impedance increase, or an influence of parasitic capacitance may be likely to become large. Therefore, the width (A) of the piezoelectric part 112 is determined by taking account of a trade-off between improvement of the voltage sensitivity and an increase in the impedance and such.

When Young's modulus of the diaphragm 110 changes with temperature, the voltage sensitivity of the piezoelectric device 100 also changes. In this respect, in the embodiment, since the diaphragm 110 is formed of a degenerate semiconductor, a change of Young's modulus of the diaphragm 110 with temperature can be suppressed. In other words, a change of the voltage sensitivity of the piezoelectric device 100 can be suppressed.

Figure 6:
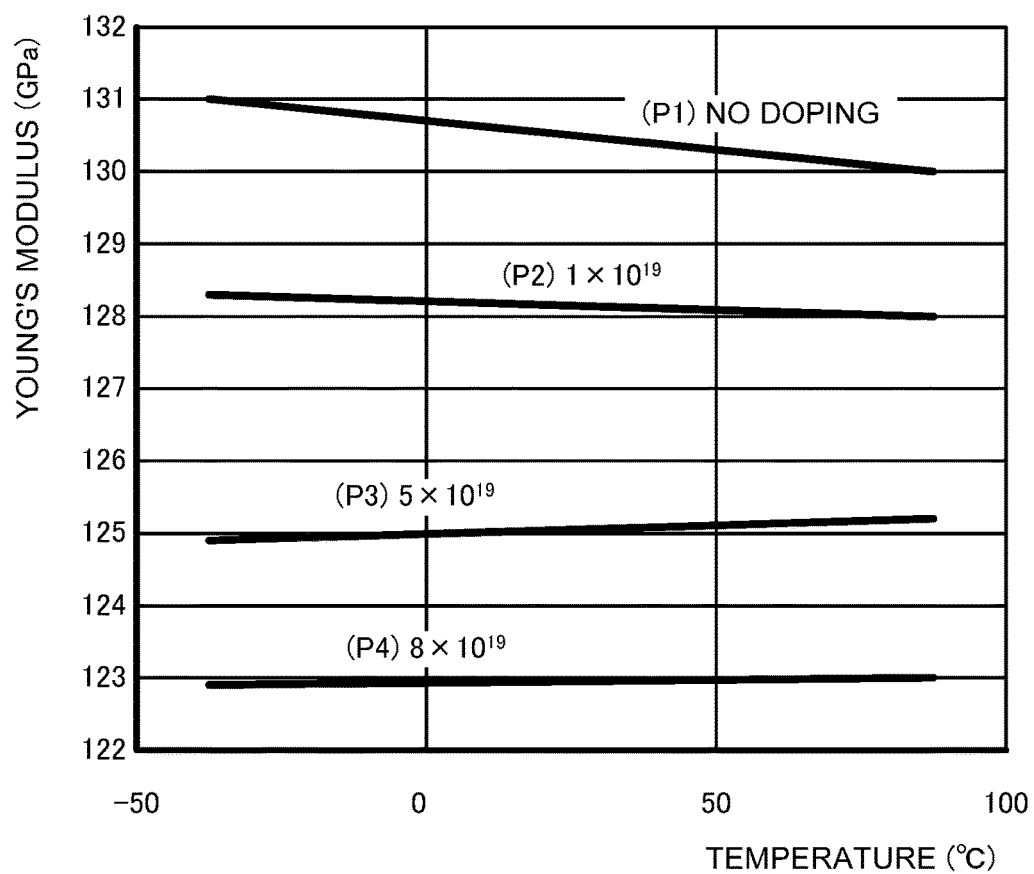
FIG. 6 is a graph showing one example of a relation between temperature and Young's modulus.

FIG. 6 is a graph showing one example of a relation between temperature and Young's modulus. In FIG. 6, the horizontal axis represents temperature (° C.) and the vertical axis represents Young's modulus (GPa). In FIG. 6, four temperature characteristics (P1) to (P4) of the diaphragm 110 with different doping concentrations are shown. P1 in FIG. 6 shows a temperature characteristic when nothing is doped into Si. P2 in FIG. 6 shows a temperature characteristic when an n-type dopant is doped into Si at a concentration of $1 \times 10^{19}$ $cm^{-3}$. P3 in FIG. 6 shows a temperature characteristic when the n-type dopant is doped into Si at a concentration of $5 \times 10^{19}$ $cm^{-3}$. P4 in FIG. 6 shows a temperature characteristic when the n-type dopant is doped into Si at a concentration of $8 \times 10^{19}$ $cm^{-3}$. As shown in FIG. 6, in comparison with Young's modulus in a case P1 where nothing is doped into Si, by making the doping concentration in Si $1 \times 10^{19}$ $cm^{-3}$ or more, in other words, by making Si into a degenerate semiconductor, the change in Young's modulus due to temperature change can be suppressed. With the diaphragm 110 being formed of a degenerate semiconductor, the change of the voltage sensitivity of the piezoelectric device 100 can be suppressed.

Figure 7:
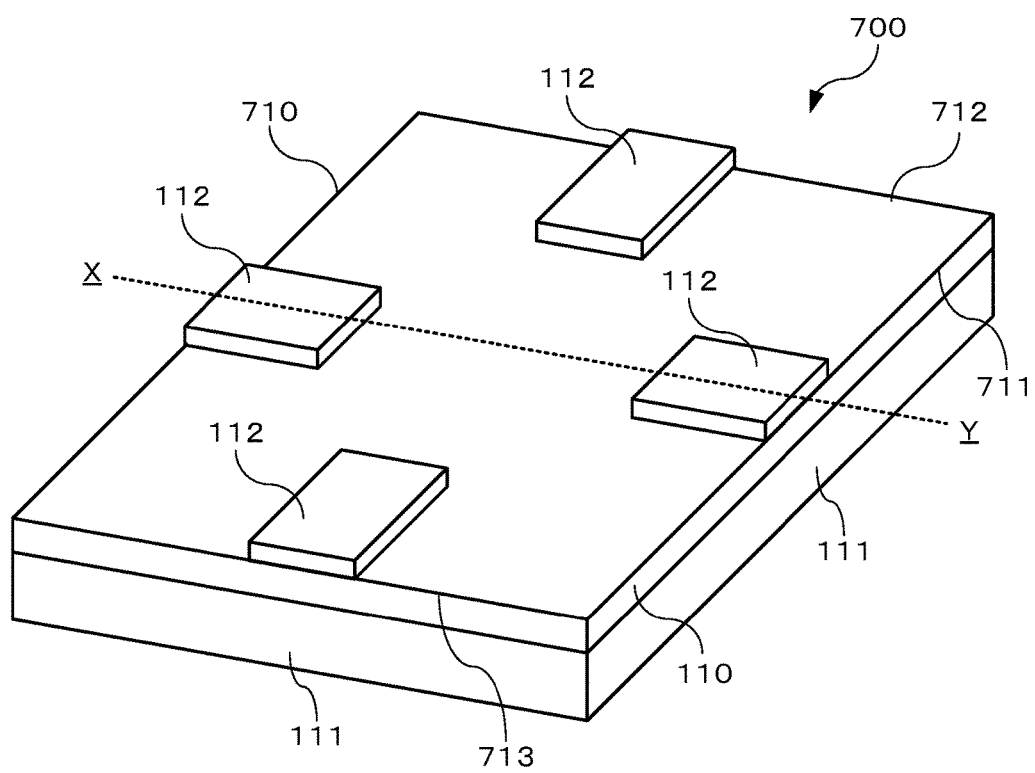
FIG. 7 is a view showing another configuration example of the piezoelectric device.

FIG. 7 is a view showing another configuration example of the piezoelectric device. As for the same components as those of the piezoelectric device 100 shown in FIG. 1, the same reference numerals are given and descriptions are omitted. As shown in FIG. 7, in the piezoelectric device 700, lower parts of all sides 710 to 713 of the diaphragm 110 are supported by the supporting part 111. In other words, the diaphragm 110 has an entire circumference supported beam structure. A configuration of a cross-section at an X-Y line shown in FIG. 7 is equivalent to the configuration shown in FIG. 2.

The piezoelectric device 100 shown in FIG. 1 has the both-end supported beam structure, wherein the diaphragm 110 is provided with the slit 113. For that reason, in the piezoelectric device 100, while the diaphragm 110 is easily bendable and the voltage sensitivity can be improved, the diaphragm 110 may be deformed due to stresses of the piezoelectric films 210 and the upper electrodes 211, which may change an amount of sound leakage from the slit 113 and may cause variations in the voltage sensitivity. On the contrary, as shown in FIG. 7, the piezoelectric device 700 is not provided with the slit 113 of the piezoelectric device 100. Therefore, in the piezoelectric device 700, no sound leakage from the slit occurs and the variations in the voltage sensitivity can be suppressed.

Figure 8:
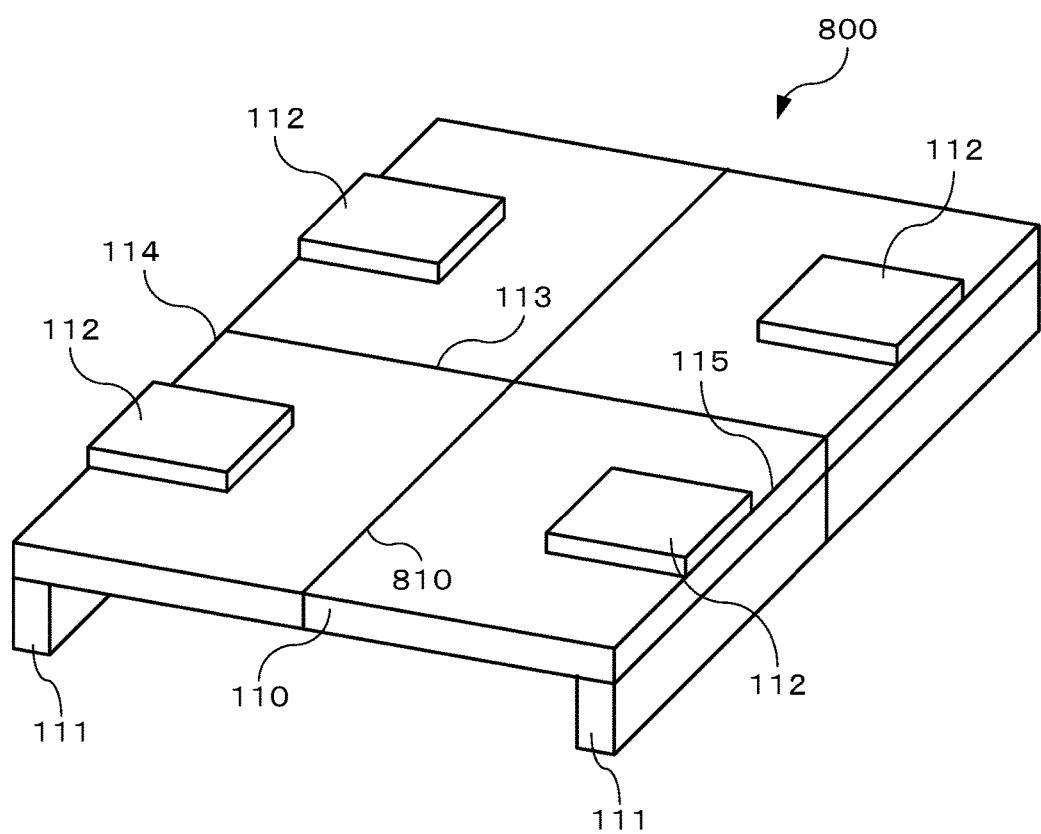
FIG. 8 is a view showing another configuration example of the piezoelectric device.

FIG. 8 is a view showing another configuration example of the piezoelectric device. As for the same components as those of the piezoelectric device 100 shown in FIG. 1, the same reference numerals are given and descriptions are omitted. As shown in FIG. 8, in a piezoelectric device 800, a slit 810 is provided along a substantial center line 810 substantially parallel to the sides 114 and 115 supported by the supporting part 111 in addition to the slit 113. The diaphragm 110 is divided into four by the slits 113 and 810. In other words, the diaphragm 110 has a cantilever structure. By making the diaphragm 110 the cantilever structure, the diaphragm 110 becomes more flexible than in the case of the piezoelectric device 100 shown in FIG. 1, and the voltage sensitivity can be improved.

Figure 9:
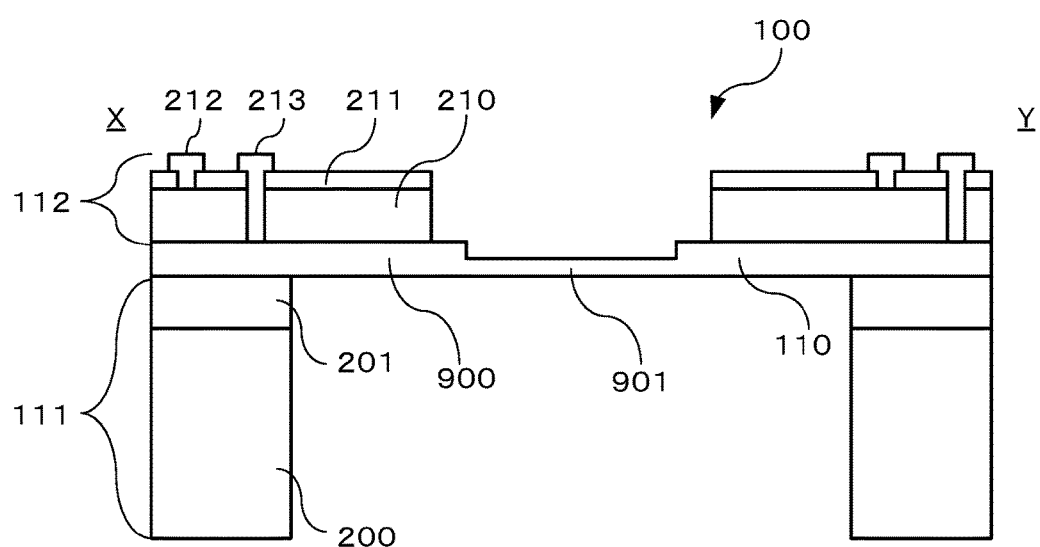
FIG. 9 is a view showing one configuration example of a diaphragm in which a vicinity of a center thereof is made thin.

FIG. 9 is a view showing one configuration example in which a vicinity of a center of the diaphragm 110 is made thin in the piezoelectric device 100 shown in FIG. 1. As shown in FIG. 9, a thickness of a region 901 in the vicinity of the center of the diaphragm 110 can be formed thinner than a thickness of a region 900 of the diaphragm 110, where the piezoelectric film 210 is disposed. In this manner, by thinning the thickness of the region 901 in the vicinity of the center of the diaphragm 110, the diaphragm 110 is made to be easily bendable, and the voltage sensitivity can be improved. Since the piezoelectric device 800 shown in the FIG. 8 is not provided with the slit 810, the deformation of the diaphragm 110 is suppressed, and the variations in the voltage sensitivity are suppressed.

Changing the thickness of the region 900 in the diaphragm 110, where the piezoelectric film 210 is disposed, changes a state of expansion and contraction of the piezoelectric film 210 resulting from the vibration of the diaphragm 110 and changes voltage output characteristics of the piezoelectric part 112. More specifically, thinning the thickness of the region 900 in the diaphragm 110, where the piezoelectric film 210 is disposed, when the piezoelectric film 210 bends downwardly for instance, may increase an amount of contraction of an under side of the piezoelectric film 210, may cancel out voltage output resulting from expansion of an upper side of the piezoelectric film 210, and may reduce the output voltage from the piezoelectric part 112. For this reason, thinning only the region 901 in a vicinity of a center without changing the thickness of the region 900 can improve the voltage sensitivity without influencing the voltage output characteristics of the piezoelectric part 112.

Not only in the configuration shown in FIG. 1 but also in the configurations shown in FIG. 7 and FIG. 8, a region in the vicinity of the center of the diaphragm 110 may be thinned.

Figure 10:
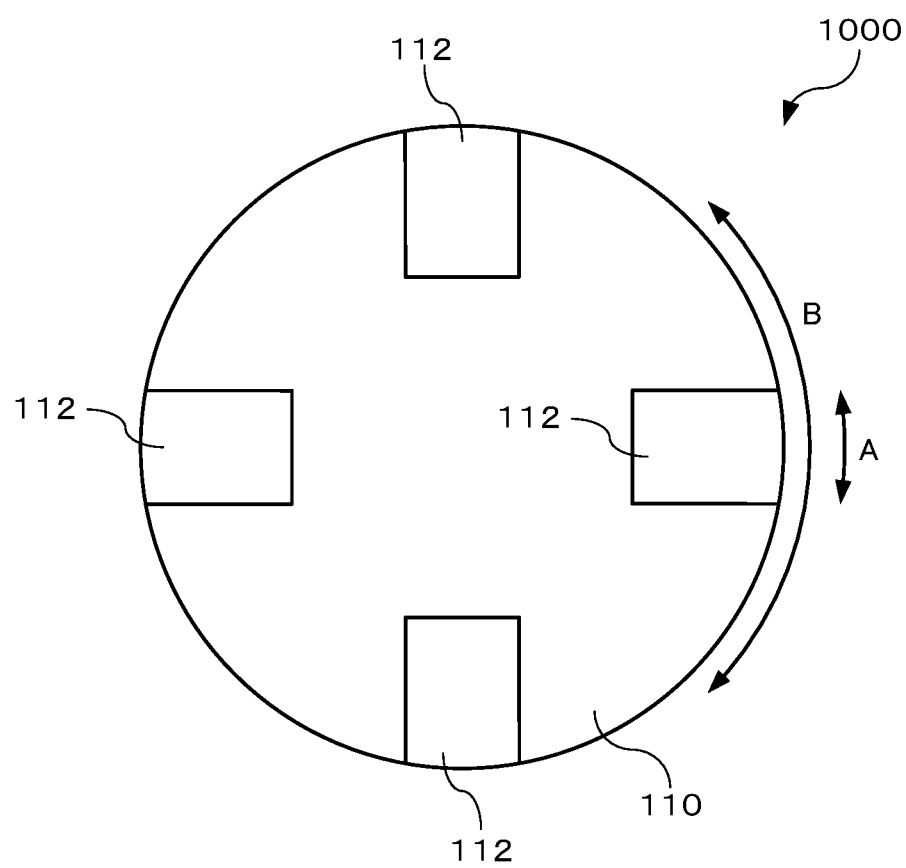
FIG. 10 is a view showing another configuration example of the piezoelectric device.
Figure 11:
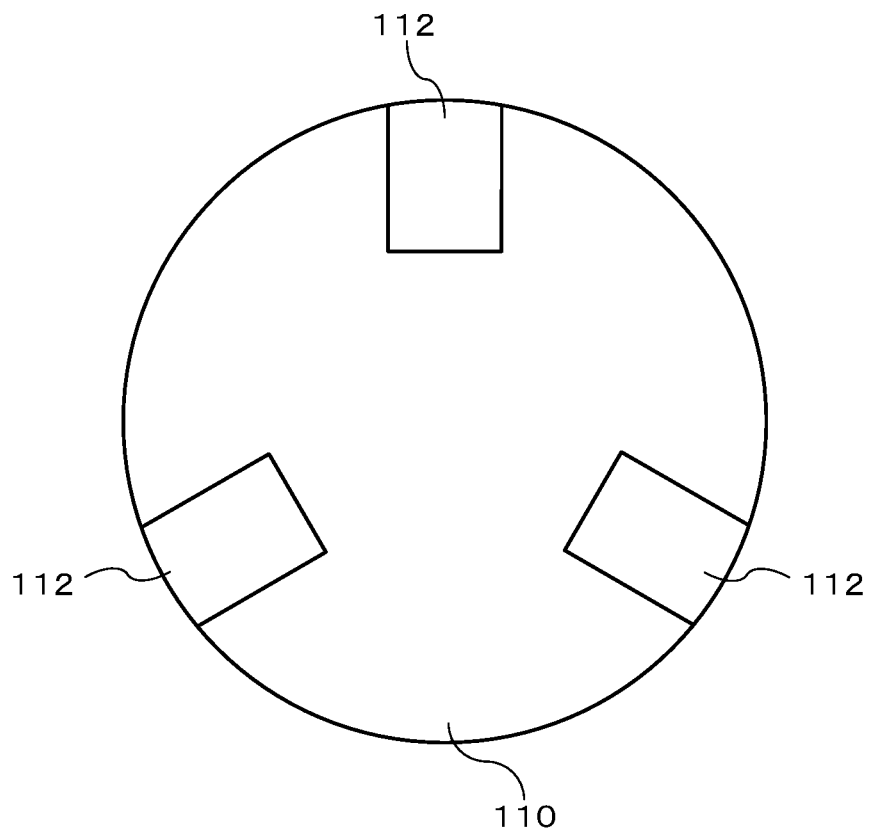
FIG. 11 is a view showing another configuration example of the piezoelectric device.

FIG. 10 is a view showing another configuration example of the piezoelectric device. As for the same components as those of the piezoelectric device 100 shown in FIG. 1, the same reference numerals are given and descriptions are omitted. As shown in FIG. 10, the diaphragm 110 has a substantially circular shape in a piezoelectric device 1000. In this case also, the width (A) of the piezoelectric part 112 is made narrower than the width (B) of the portion supported by supporting part 111 in the diaphragm 110 of the piezoelectric part 112. In this manner, the diaphragm 110 may have not only a substantially rectangular shape but also an arbitrary shape. Although four piezoelectric parts 112 are disposed on the diaphragm 110 in FIG. 10, the number of the piezoelectric parts 112 is not limited to this but may be any number. For instance, as shown in FIG. 11 three piezoelectric parts 112 may be disposed on the diaphragm 110 having a substantially circular shape.

Figure 12:
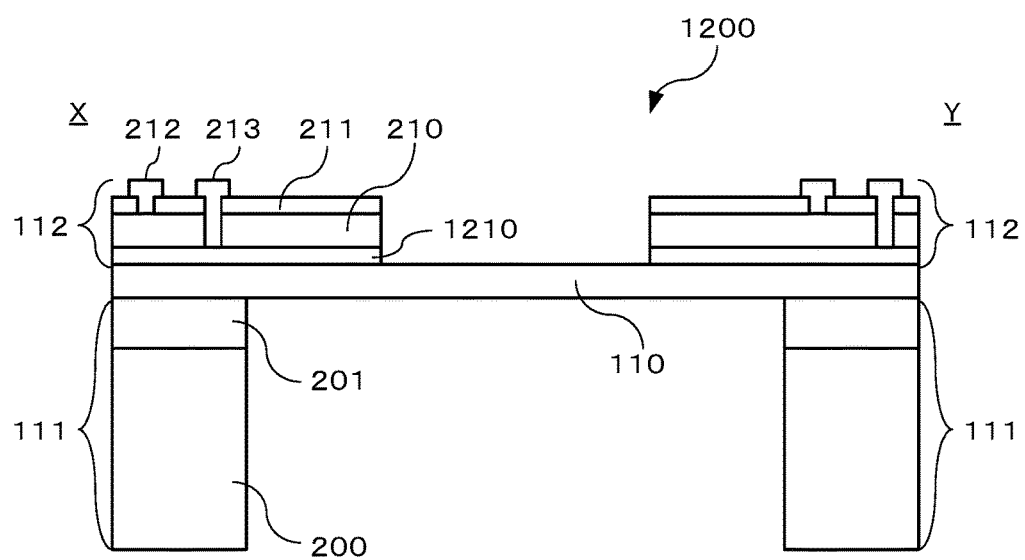
FIG. 12 is a view showing another configuration example of the piezoelectric device.

FIG. 12 is a view showing another configuration example of the piezoelectric device. As for the same components as those of the piezoelectric device 100 shown in FIG. 2, the same reference numerals are given and descriptions are omitted. As shown in FIG. 2, the diaphragm 110 is used as a lower electrode of the piezoelectric part 112 in the piezoelectric device 100. On the other hand, in a piezoelectric device shown in FIG. 12, a lower electrode 1210 is provided separately from the diaphragm 110. The lower electrode 1210 is a metal electrode and may be formed of aluminum (Al) for instance, and may have a thickness of about 50 nm.

The embodiments of the present invention have been described above. According to the embodiments, the piezoelectric device is formed so that the width (A) of the piezoelectric part 112 is narrower than the width (B) of the portion supported by the supporting part 111 in the diaphragm 110. This increases a stress applied to a unit area of the piezoelectric part 112, and enables enhancement of the voltage sensitivity and the generated energy in the piezoelectric part 112. In other words, the sensitivity of a MEMS microphone configured by using the piezoelectric device 100 can be improved.

According to the embodiment, the diaphragm 110 can be formed of a degenerate semiconductor. Thereby, variations in the Young's modulus of the diaphragm 110 with temperature can be suppressed, and variations in the voltage sensitivity of the piezoelectric device with temperature can be suppressed.

According to the embodiment, the diaphragm 110 formed of a degenerate semiconductor can be used as a lower electrode of the piezoelectric part 112. Thereby, the piezoelectric device 100 can be downsized as compared with a case where the lower electrode is formed separately from the diaphragm 110.

According to the embodiment, as shown in FIG. 1, making the diaphragm 110 have the both-end supported beam structure makes it possible to make the diaphragm 110 easily bendable and to improve the voltage sensitivity of the piezoelectric device.

According to the embodiment, as shown in FIG. 8, when making the diaphragm 110 have the both-end supported beam structure, the substantial center line 810 substantially parallel to the sides 114 and 115 of the supporting part 111 makes the diaphragm 110 have a separate configuration, thereby, making the diaphragm 110 more bendable and being able to improve the voltage sensitivity of the piezoelectric device.

According to the embodiment, as shown in FIG. 7, making the diaphragm 110 have the entire circumference supported beam structure makes it possible to suppress the deformation of the diaphragm 110 and to suppress the variations in the voltage sensitivity caused by the deformation of the diaphragm 110.

According to the embodiment, as shown in FIG. 9, making the region 901 in the vicinity of the center of the diaphragm 110 thin makes it possible to make the diaphragm 110 more bendable and to improve the voltage sensitivity of the piezoelectric device.

According to the embodiment, it is possible to make the upper electrode 211 formed at an upper side of the piezoelectric film 210 having a compressive stress have a tensile stress. Thereby, the stress at the piezoelectric part 112 is corrected, and the deformation of the diaphragm 110 is suppressed.

The embodiment is for facilitating comprehension of the present invention, and not for comprehending by limiting the present invention. The present invention can be changed and/or improved without being deviated from the gist thereof. The present invention includes also equivalents thereof.

For instance, in the embodiment, although an example is described in which the piezoelectric device is used as a MEMS microphone by vibrating the diaphragm by sound pressure, uses of the piezoelectric device is not limited to this, and is usable for a sensor that detects vibration of a medium in the surrounding of the piezoelectric device.

We claim:

1. A piezoelectric device comprising:
a diaphragm having a first surface and a second surface;
a supporting part adjacent the second surface of the diaphragm and configured to support at least a portion of at least one end of opposing ends of the diaphragm;
a piezoelectric film adjacent the first surface of the diaphragm and disposed along the portion of the at least one end of the diaphragm supported by the supporting part, wherein the piezoelectric film comprises a width that opposes the supported portion and is narrower than a width of the supported portion; and
an electrode disposed on a surface of the piezoelectric film opposite to the diaphragm,
wherein the piezoelectric film extends from the at least one end of the diaphragm towards the other end of the opposing ends of the diaphragm and does not extend to a center portion of the diaphragm between the opposing ends of the diaphragm.

2. The piezoelectric device according to claim 1, wherein the diaphragm is formed of a degenerate semiconductor.

3. The piezoelectric device according to claim 2, wherein the electrode is an upper electrode and the diaphragm is configured to function as a lower electrode for the piezoelectric film.

4. The piezoelectric device according to claim 1, wherein the electrode is an upper electrode and the piezoelectric device includes a lower electrode disposed on a surface of the diaphragm.

5. The piezoelectric device according to claim 1, wherein the diaphragm has a substantially rectangular shape.

6. The piezoelectric device according to claim 5, wherein the supporting part is configured to support a pair of opposing sides of the diaphragm, wherein the opposing sides correspond to the opposing ends of the diaphragm.

7. The piezoelectric device according to claim 6, further comprising a plurality of piezoelectric films disposed along each side of the pair of sides of the diaphragm.

8. The piezoelectric device according to claim 7, wherein the diaphragm is divided along a first substantial center line substantially parallel to the pair of opposing sides.

9. The piezoelectric device according to claim 8, wherein the diaphragm is further divided along a second substantial center line substantially perpendicular to the pair of opposing sides.

10. A piezoelectric device comprising:
a diaphragm having rectangular shape with first and second surfaces that oppose each other;
a supporting part configured to support opposing sides of the diaphragm, the support being adjacent the second surface of the diaphragm;
a plurality of piezoelectric films disposed adjacent the first surface of the diaphragm and along each side of the diaphragm, wherein at least a pair of the plurality of piezoelectric films are disposed along each side of the diaphragm with each piezoelectric film having a width that opposes the supported portion and the is narrower than a width of the supported portion; and
a plurality of electrodes disposed on a surface of each of the piezoelectric films, respectively, opposite to the diaphragm,
wherein each of the plurality of piezoelectric film extends towards an opposing side of the diaphragm and does not extend to a center portion of the diaphragm between the opposing sides, respectively of the diaphragm.

11. The piezoelectric device according to claim 1, wherein the diaphragm is thinner at a center region thereof than a region thereof where the piezoelectric film is disposed.

12. The piezoelectric device according to claim 1, wherein
the piezoelectric film has a compressive stress, and
the upper electrode has a tensile stress.

13. The piezoelectric device according to claim 1, wherein the supporting part includes a supporting part and an insulating layer.

14. The piezoelectric device according to claim 13, wherein the insulating layer is adjacent the diaphragm.

15. The piezoelectric device according to claim 14, wherein the insulating layer is silicon oxide.

16. The piezoelectric device according to claim 1, further comprising a plurality of piezoelectric films adjacent to the first surface of the diaphragm, the plurality of piezoelectric films being electrically coupled in parallel to each other.

17. The piezoelectric device according to claim 1, further comprising a plurality of piezoelectric films adjacent to the first surface of the diaphragm,
wherein a first portion of the plurality of piezoelectric films are electrically coupled in parallel to each other and a second portion of the plurality of piezoelectric films are electrically coupled in parallel to each other, and wherein the first and second portions of the plurality of piezoelectric films are electrically coupled in series to each other.

18. The piezoelectric device according to claim 1, further comprising a plurality of piezoelectric films adjacent to the first surface of the diaphragm,
wherein a first portion of the plurality of piezoelectric films are electrically coupled in series to each other and a second portion of the plurality of piezoelectric films are electrically coupled in series to each other, and
wherein the first and second portions of the plurality of piezoelectric films are electrically coupled in parallel to each other.

19. The piezoelectric device according to claim 1, wherein the diaphragm has a substantially circular shape.

* * * * *